US006366468B1

(12) United States Patent
Pan

(10) Patent No.: US 6,366,468 B1
(45) Date of Patent: Apr. 2, 2002

(54) SELF-ALIGNED COMMON CARRIER

(75) Inventor: Alfred I-Tsung Pan, Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/560,943

(22) Filed: Apr. 28, 2000

(51) Int. Cl.[7] ................................................ H05K 1/18
(52) U.S. Cl. ...................... 361/761; 361/760; 361/783; 361/782; 361/768; 361/811; 361/820; 257/723; 257/724
(58) Field of Search ........................... 361/760, 761, 361/764, 762, 783, 798, 782, 767, 768, 771, 801, 811, 820; 29/739; 257/723, 724

(56) References Cited

U.S. PATENT DOCUMENTS

| 4,670,770 A | | 6/1987 | Tai ................................ 357/60 |
| 5,205,032 A | * | 4/1993 | Kuroda et al. ................. 29/740 |
| 5,706,176 A | * | 1/1998 | Quinn et al. ................. 361/760 |
| 5,717,803 A | | 2/1998 | Yoneda et al. ................. 385/89 |
| 6,064,116 A | * | 5/2000 | Akram ......................... 257/723 |

OTHER PUBLICATIONS

V.G. Kutchoukov—"Uniform Photoresist Coating of Anisotropically Etched Cavities in Silicon"—1999—pp. 697–700.

* cited by examiner

Primary Examiner—Jayprakash N. Gandhi
Assistant Examiner—Thanh Y. Tran
(74) Attorney, Agent, or Firm—Trueman H. Denny, III

(57) ABSTRACT

Precision alignment of one or more parts on a common carrier is described. A self-aligned common carrier includes a carrier substrate having one or more pockets formed in the substrate. Each pocket includes a side profile formed in the pocket. A chip having an identical side profile that complements the side profile in the pocket is mounted to the carrier substrate by inserting the chip into the pocket. The complementary side profiles result in near perfect self-alignment between the chip and at least two orthogonal planes of the carrier substrate. The chip and the carrier substrate can be made from a single crystal semiconductor material and the side profiles can be formed by anisotropic etch process that selectively etches the chip and the substrate along a predetermined crystalline plane. The chip and the carrier substrate can be single crystal silicon having a (100) crystalline orientation and the side profiles can be formed by selectively etching the silicon along a (111) crystalline plane. The matching coefficients of thermal expansion between the chip and the carrier substrate substantially reduces thermal stress related interconnect failures and misalignment between the chip and the carrier substrate. The carrier substrate and the chip can be anodically bonded to each other by oxidizing either one of the carrier substrate and the chip and etching the side profiles so that they are atomically flat.

13 Claims, 8 Drawing Sheets

SELF-ALIGNED COMMON CARRIER

FIELD OF THE INVENTION

The present invention relates generally to precision alignment of one or more parts on a common carrier. More specifically, the present invention relates to a self-aligned common carrier including a carrier substrate having a predetermined crystalline orientation and a pocket formed in the carrier substrate by etching a surface of the substrate along a predetermined crystalline plane. A chip having a surface thereof etched along an identical crystalline plane is mounted to the carrier substrate by inserting the chip into the pocket. The crystalline planes are complementary to each other thereby resulting in near perfect self-alignment between the chip and the carrier substrate.

Articles and publications set forth herein are presented for the information contained therein: none of the information is admitted to be statutory "prior art" and we reserve the right to establish prior inventorship with respect to any such information.

BACKGROUND ART

It is well known in the art to use an inkjet printer for applications that require a hardcopy printout on a sheet of media. For example, it is commonplace to use an inkjet printer to print on sheets of paper, transparencies, labels, and the like. In a typical inkjet printer, a carriage holds one or more ink cartridges. Each cartridge has an inkjet printhead (pen) that includes several nozzles from which ink is ejected in a direction that causes the ink to impinge on the sheet of media. Typically, the carriage must travel across the media so that each pen can reach the full area of the media. The media to be printed on is usually driven along a media axis of motion and the pen is driven along a carriage axis of motion that is perpendicular to the media axis. In color inkjet printers, two or more cartridges are needed to print color images. For instance, a color inkjet printer can have four cartridges (black, cyan, magenta, and yellow) with a pen for each color. Consequently, in a four cartridge printer, the carriage must travel the width of the media, plus the width of the four pens, plus the space between pens. Therefore, the width of the inkjet printer is determined to a large extent by the distance the carriage must travel in order to print images on the full area of the media. For example, in an inkjet plotter, the carriage may have to travel a distance greater than the width of a D-size sheet of media.

Because the carriage must travel across the media, the time it takes to print images includes the travel time for the carriage. Additionally, the mechanical components that move the carriage add to the complexity, size, and weight of the printer and are a source of noise and vibration that can be annoying to a user of the printer.

Moreover, the pens in inkjet printers require periodic alignment to ensure consistent quality in the printed image. Because the pens are mounted in separate cartridges, there is always a risk of misalignment between pens, particularly when one or more cartridges are replaced.

Prior attempts to solve the above mentioned limitations and disadvantages of multiple cartridge inkjet printers include mounting a plurality of inkjet printheads onto a wide substrate such as a multi-layer ceramic substrate or flexible substrate. Those solutions have several disadvantages.

First, expensive precision tooling is required to align the printheads to the substrate. Second, a mismatch between the coefficient of thermal expansion for the printhead and the substrate can result in thermal induced stress on the interconnect used to electrically connect the substrate to the printheads. Additionally, the mismatch can result in misalignment between the substrate and the printheads. Third, the interconnect, the materials used for the substrate, and adhesives used to attach the printheads to the substrate are subject to failures due to the corrosive effects of the ink used in inkjet printers. Forth, the inkjet pens are sensitive to temperature variations caused by waste heat from the printheads. The substrate must have a high thermal conductivity so that the waste heat can be dissipated. If the substrate has a low thermal conductivity, then the waste heat can raise the temperature of the pens resulting in an increase in the pens drop volume. Subsequently, a temperature differential exists among the printheads so that the drop volumes of the printheads can vary depending on their location on the substrate. Ideally, the thermal conductivity of the substrate and the printheads would be identical so that there is no temperature differential between the printheads resulting in consistent drop volumes among the printheads.

Therefore, there is a need for a carrier that can mount one or more inkjet printheads in alignment with one another and with the carrier and does not require expensive precision tooling to align the printheads to the carrier. Moreover, there is a need for a carrier that has a high thermal conductivity, a coefficient of thermal expansion that matches the coefficient of thermal expansion of the printheads, and is made from a material that is resistant to the corrosive effects of ink.

SUMMARY OF THE INVENTION

Broadly, the present invention is embodied in a common carrier that includes a carrier substrate having one or more pockets formed in the substrate. Each pocket includes a side profile formed in the pocket. A chip having an identical side profile that complements the side profile in the pocket is mounted to the carrier substrate by inserting the chip into the pocket. The complementary side profiles result in near perfect self-alignment between the chip and the carrier substrate.

The carrier substrate and the chip can be made from identical materials. The side profiles can be formed by etching the carrier substrate and the chip along identical crystalline planes. The problems associated with thermal mismatch and low thermal conductivity are solved by using identical materials with a high thermal conductivity for the carrier substrate and the chip. Furthermore, the materials for the carrier substrate and the chip can be selected to be resistant to the corrosive effects of ink. The problems associated with alignment between the carrier substrate and the chip are solved by etching the pocket and the chip along identical crystal planes.

In one embodiment of the present invention, the carrier substrate and the chip are made from a single crystal semiconductor material and the side profiles are formed by etching the side profiles along identical crystal planes.

In another embodiment of the present invention, the side profiles are formed by an anisotropic etch process.

In one embodiment of the present invention, the carrier substrate and the chip are made from a single crystal silicon material and the side profiles are formed by etching the side profiles along identical crystal planes of the single crystal silicon.

In another embodiment of the present invention, the single crystal silicon for the carrier substrate and the chip has a (100) crystalline orientation and the side profiles are formed by etching along a (111) crystalline plane of the carrier substrate and the chip.

Other aspects and advantages of the present invention will become apparent from the following detailed description, taken in conjunction with the accompanying drawings, illustrating by way of example the principles of the present invention.

DETAILED DESCRIPTION

Figure 1:
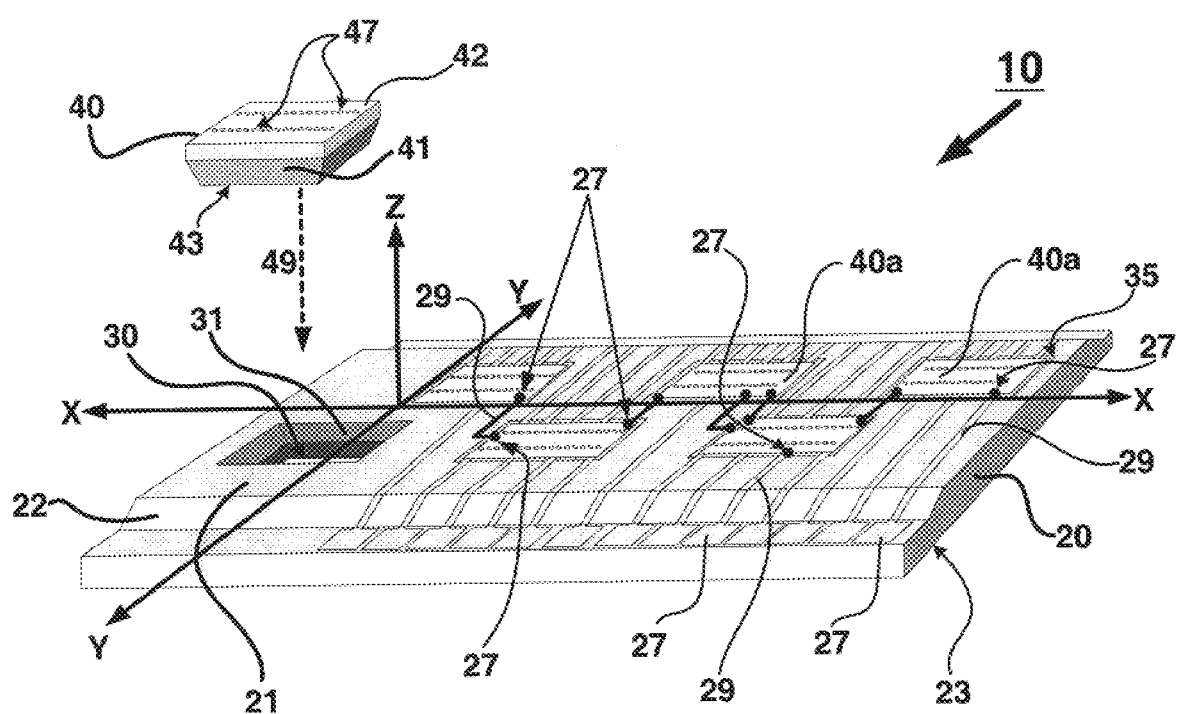
FIG. 1 is a plan view illustrating a self-aligned common carrier according to the present invention.

In the following detailed description and in the several figures of the drawings, like elements are identified with like reference numerals.

As shown in the drawings for purpose of illustration, the present invention is embodied in a self-aligned common carrier including a carrier substrate having one or more pockets formed in the carrier substrate. Each pocket includes a first side profile formed in the pocket. A chip having a second side profile that is identical to first side profile and complements the first side profile is mounted to the carrier substrate by inserting the chip into the pocket. The complementary side profiles result in the chip being positioned in near perfect self-alignment with at least two orthogonal planes of the carrier substrate. The carrier substrate and the chip can be made from a single crystal semiconductor material and the first and second side profiles can be formed by etching those side profiles along identical crystalline planes of the single crystal semiconductor material.

In FIG. 1, a self-aligned common carrier 10 includes a carrier substrate 20. The carrier substrate 20 includes a pocket 30 formed in a mounting surface 21 of the carrier substrate 20. The pocket 30 extends at least partially towards the a backside surface 23 of the carrier substrate 20. Preferably, the pocket 30 extends completely through the carrier substrate 20. The pocket 30 includes a first sidewall profile 31 formed on at least a portion of the pocket 30. A chip 40 includes a base portion 43 and a second side profile 41 formed on at least a portion of the base surface 43. The second side profile 41 is substantially identical to the first side profile 31 so that the second side profile 41 and the first side profile 31 complement each other. The chip 40 is mounted to the carrier substrate 20 by inserting the chip 40 into the pocket 30 (shown by dashed arrow 49) so that the second side profile 41 is mated to the first side profile 31. Since the first 31 and second 41 side profiles complement each other, the chip 40 is positioned in near perfect self-alignment with at least two orthogonal planes of the carrier substrate 20. Additionally, the carrier substrate 20 may include a step 22 formed along a crystalline plane of the carrier substrate 20 by etching the carrier substrate 20 as will be discussed in detail below.

In FIG. 1, a plurality of mounted chips 40a are illustrated; however, the self-aligned common carrier 10 can include one pocket 30 for mounting one chip 40 or the self-aligned common carrier 10 can include a plurality of pockets 30 in which a plurality of chips 40 can be mounted.

Figure 10:
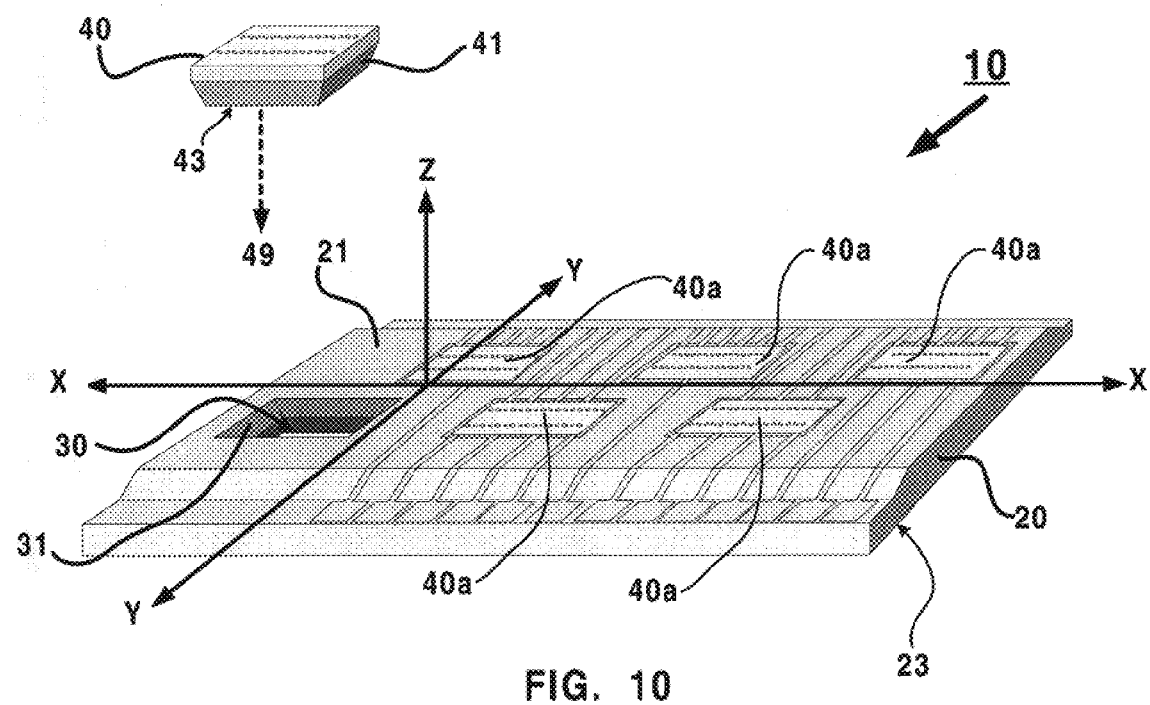
FIG. 10 is a plan view illustrating mounted chips positioned in near perfect self-alignment with at least two orthogonal planes of the carrier substrate according to the present invention.

In one embodiment of the present invention, as illustrated in FIG. 10, the mounted chips 40a are positioned in near perfect self-alignment with an X-plane X and a Y-plane Y of the carrier substrate 20. The X-plane X and the Y-plane Y are positioned in orthogonal relation to each other.

In another embodiment of the present invention, also illustrated in FIG. 10, the mounted chips 40a are substantially self-aligned with a Z-plane Z of the carrier substrate 20. Near perfect self-alignment in the X-plane X and the Y-plane Y results from the complementary first 31 and second 41 side profiles as discussed above; however, differences in the thickness of the chip 40 can result in variations in the height of the mounted chips 40a relative to the mounting surface 21. Consequently, the mounted chips 40a are substantially self-aligned with the Z-plane Z but may vary slightly in height relative to the Z-plane Z. Those variations in height can be minimized or eliminated by selecting each chip 40 from the same substrate. For instance, each chip 40 can be selected from a wafer or a slab of semiconductor material. The semiconductor material should be selected for uniformity of thickness. Another factor that can create variations in height is the etching of the side profiles as will be discussed below. For example, variations in etch temperature, time, and etch solution concentration can effect the etch rate (i.e. the amount of material dissolved per unit of time).

In one embodiment of the present invention, the self-aligned common carrier 10 includes at least two electrically conductive nodes 27 disposed on either one of the carrier substrate 20 and the chip 40. An interconnect 29 is adapted to electrically connect the electrically conductive nodes 27. For instance, the interconnect 29 can connect the electrically conductive nodes 27 between mounted chips 40a or the interconnect 29 can connect the electrically conductive nodes 27 between the mounted chip 40a and the carrier substrate 20. The node 27 on the carrier substrate 20 can be a contact pad and the node 27 on the chip 40 can be a bonding pad, for example. The interconnect 29 can be implemented using ribbon wire, for example.

Figure 2:
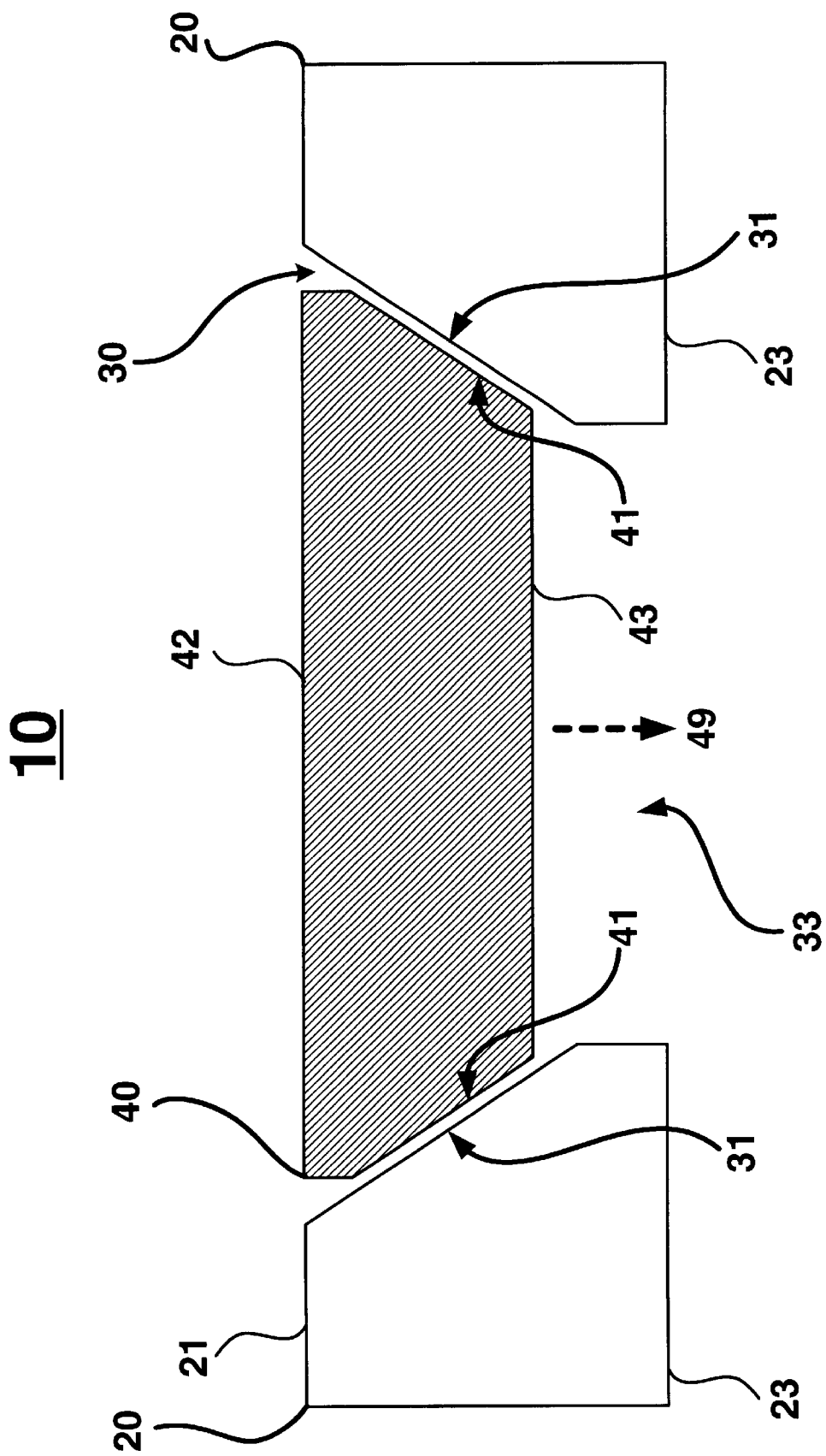
FIG. 2 is a cross-sectional view illustrating a chip being inserted into a pocket a carrier substrate according to the present invention.
Figure 3:
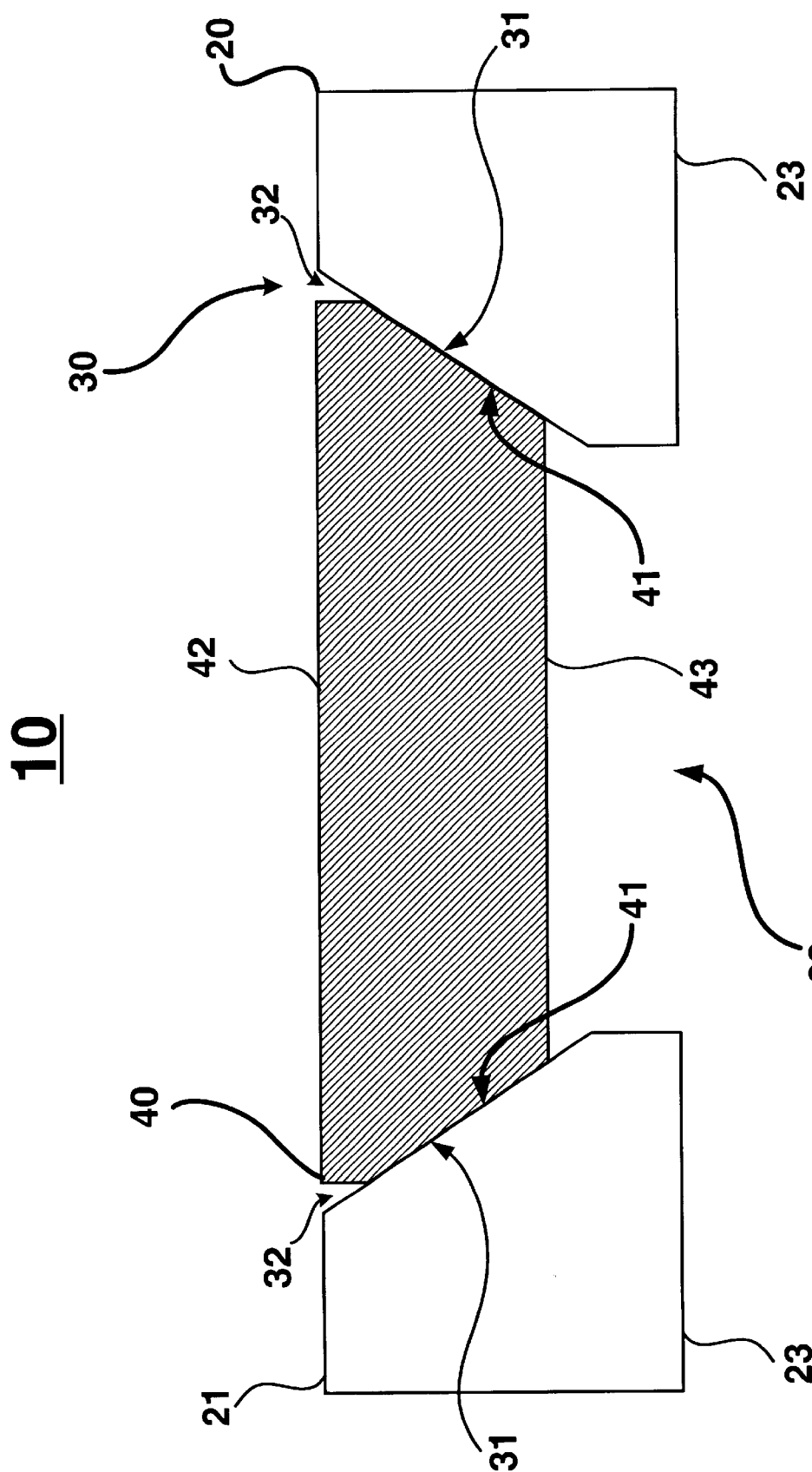
FIG. 3 is a cross-sectional view illustrating the chip mounted to the carrier substrate according to the present invention.

In FIG. 2, the chip 40 is illustrated prior to being mounted to the carrier substrate 20. The first side profile 31 of the pocket 30 and the second side profile 41 of the chip 40 complement each other as was discussed above. Consequently, when the chip 40 is completely inserted into the pocket 30, as illustrated in FIG. 3, and the second side profile 41 is mated to the first side profile 31, the chip 40 is positioned in near perfect self-alignment with the carrier substrate 20. The pocket 30 can extend between the mounting surface 21 and the backside surface 23 forming an aperture 33 in the backside surface 23, as illustrated in FIGS.

2 and 3. For example, if the chip 40 is a inkjet printhead, then the aperture 33 can be in fluid communication with an ink supply (not shown) for supplying ink to the printhead. The aperture 33 can also be used to expose the base surface 43 of the chip 40 so that electrical connections or a thermal sink can be connected to the chip 40.

In another embodiment of the present invention, the carrier substrate 20 and the chip 40 are made from a single crystal semiconductor material. The single crystal semiconductor material is preferred because it is adapted to being chemically machined (etched) along know crystalline planes. Accordingly, the first side profile 31 of the pocket 30 and the second side profile 41 of the chip 40 are formed by etching those side profiles along identical crystalline planes of the single crystal semiconductor material. The first side profile 31 and the second side profile 41 can be formed by an anisotropic etch process that is adapted to successively dilute layers of the single crystal semiconductor material. The rate at which the material is etched depends to a large extent on which crystalline planes are exposed to the etchant. For instance, a gallium arsenide (GaAs) substrate will etch faster along the (111) arsenic (As) crystalline plane of the substrate than any other crystalline plane. Anisotropic differential rate etching processes and materials are well known in the art. The anisotropic etch process used will depend on the type of single crystal semiconductor material and on the type of etchant used. For instance, some etchants are more suitable for etching silicon (Si) and other etchants are more suitable for etching gallium arsenide.

In one embodiment of the present invention, the carrier substrate 20 and the chip 40 are made from single crystal silicon. The first side profile 31 of the pocket 30 and the second side profile 41 of the chip 40 are formed by etching those side profiles along identical crystalline planes of the single crystal silicon. Preferably, the single crystal silicon is a (100) silicon (Si) substrate obtained by cutting a lengthwise (100) Si substrate from a 110 Si ingot. Additionally, a large (100) Si wafer can be used as the starting material for the carrier substrate 20.

Typically, the Si ingot is formed by touching a single crystal Si seed, in this case a 110 seed, to a melt surface and then slowly pulling the seed upward to grow the 110 Si ingot from the melt. The resulting 110 Si ingot can then be cut into thin slices by a diamond saw to form a raw (100) Si substrate. The surfaces of the raw (100) Si substrate are then lapped, etched, and heat treated, followed by polishing, cleaning and inspection. Resulting is a finished (100) Si substrate. The finished (100) Si substrate can be of differing grades of quality. For microelectronics applications, the finished (100) Si substrate is referred to as a "Prime Wafer". However, for the carrier substrate 20 of the present invention, a lower grade "Test Wafer" or "Monitor Wafer" (100) Si substrate can be used. The shape of the (100) Si substrate need not be in the shape of a typical semiconductor wafer (i.e. substantially round). Preferably, the shape of the (100) Si substrate is rectangular. The grade of the finished (100) Si substrate selected for the chip 40 will be application specific. For instance, if the chip 40 is a thermal inkjet printhead, then the "Prime Wafer" grade can be selected for the chip 40. On the other hand, for applications that do not require microelectronic fabrication a lower grade such as the "Test Wafer" or "Monitor Wafer" grade can be selected for the chip 40. The size (length and width) of the (100) Si substrate will depend on the size of the 110 Si ingot. For instance, the (100) Si substrate can be from 8 inches long to over 72 inches long. Longer lengths for the (100) Si substrate may require the substrate be made thicker to mechanically support itself. Although the above discussion has focused on a (100) Si substrate, the present invention is not to be construed as being limited to the (100) Si substrate.

Figure 9:
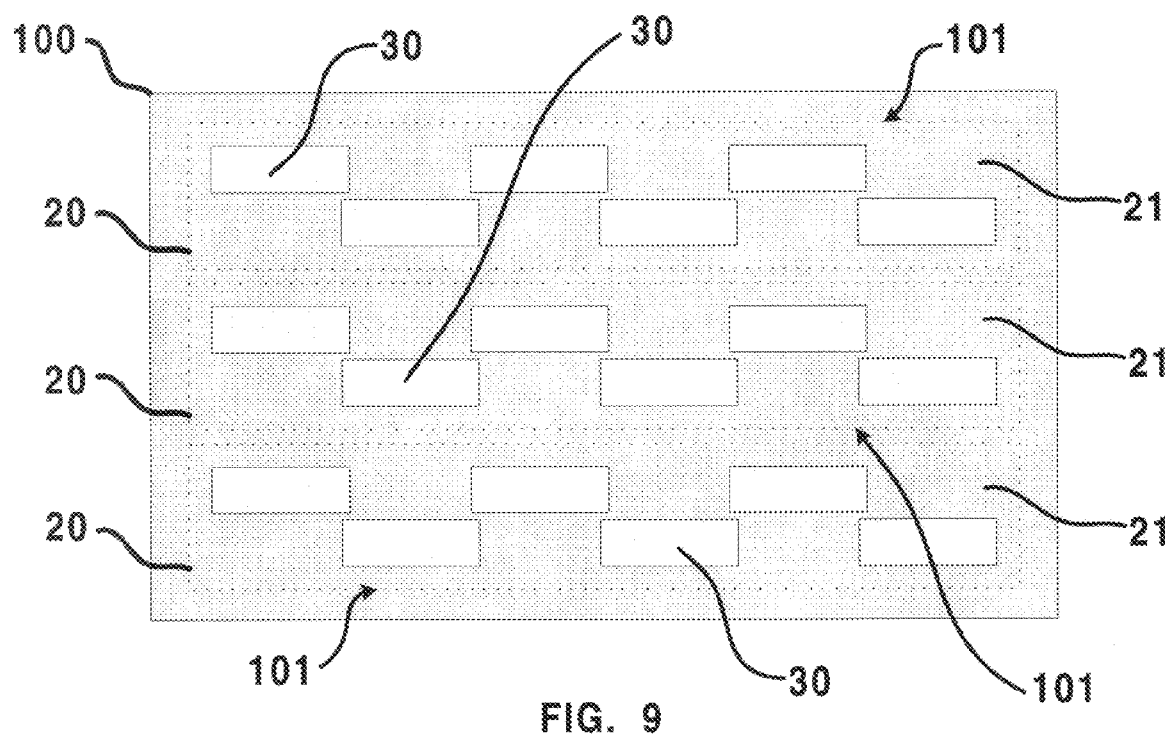
FIG. 9 is a top plan view of a substrate that includes a plurality of the carrier substrates according to the present invention.

In FIG. 9, a plurality of carrier substrates 20 are formed on a single Si substrate 100, preferably a (100) Si substrate. Each carrier substrate 20 can have at least one pocket 30 formed in the mounting surface 21 thereof. The carrier substrates 20 can be extracted from the single Si substrate 100 by cleaving those substrates along predetermined scribe lines 101. If the mounting surface 21 has a (100) crystalline orientation, then the scribe lines 101 can be formed along the (111) crystalline plane to ensure an easy cleavage plane. Preferably, the carrier substrates 20 are extracted from the single Si substrate 100 using a precision saw, such as a diamond saw, for example. A general discussion of semiconductor crystalline structure and selective etch materials to preferentially etch exposed crystalline planes can be found in "VLSI fabrication principles: silicon and gallium arsenide", Sorab K. Ghandhi, 1983, John Wiley & Sons, pp 3–12, and pp 476–492.

Figure 6:
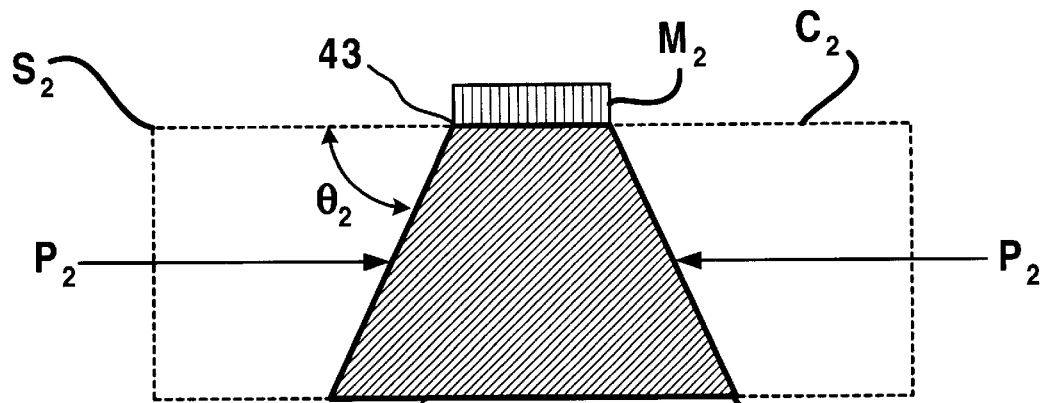
FIGS. 6 through 8 are cross-sectional views illustrating etching of the chip and the pocket along predetermined crystalline planes according to the present invention.
Figure 7:
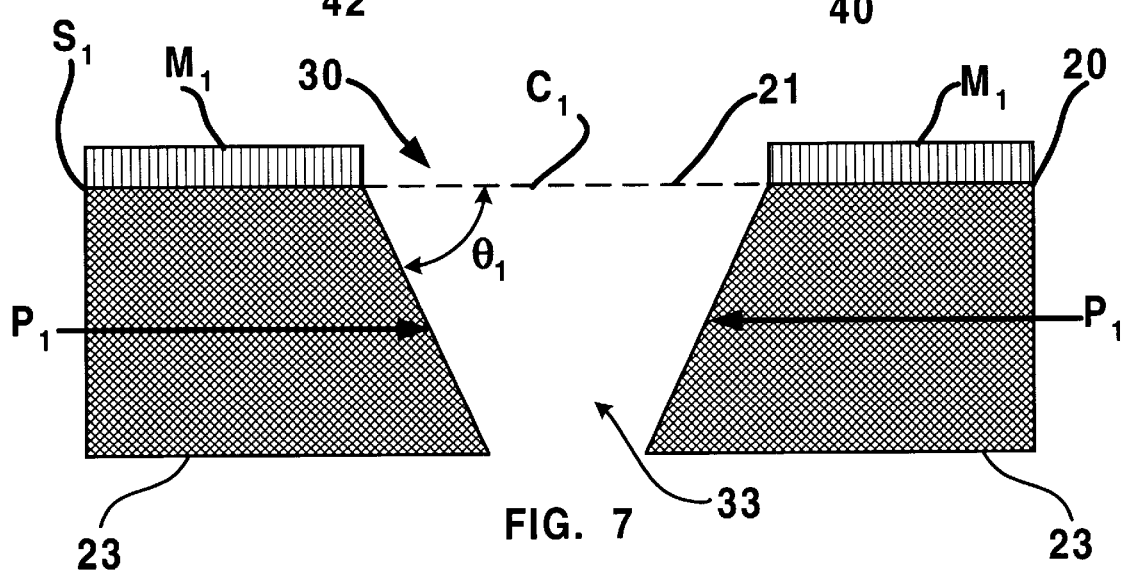
Figure 8:
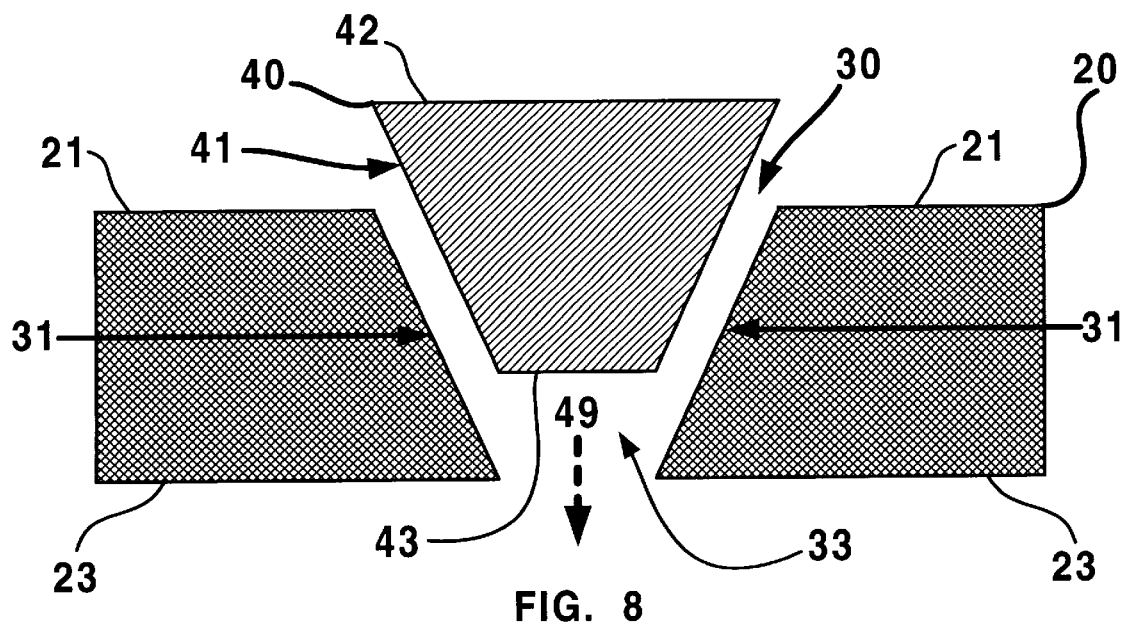

In another embodiment of the present invention, as illustrated in FIGS. 6 through 8, the mounting surface 21 (shown in dashed line in FIG. 7) of the carrier substrate 20 has a (100) crystalline orientation $C_1$ and the base surface 43 (see FIG. 6) of the chip 40 has a (100) crystalline orientation $C_2$; therefore, $C_1=C_2$ because both surfaces (21 and 43) have the (100) crystalline orientation. The (100) crystalline orientation for the mounting surface 21 and the base surface 43 can be obtained by selecting a (100) single crystal substrate $S_1$ and $S_2$ respectively, for the carrier substrate 20 and the chip 40. The pocket 30 and the chip 40 are formed by preferentially etching exposed portions ((100) crystalline orientation ) of the mounting surface 21 and the base surface 43. Resulting are side profiles $P_1$ and $P_2$ respectively that match the orientation of the etched crystalline planes. In FIG. 8, the first side profile 31 is formed by etching the mounting surface 21 along a (111) crystalline plane and the second side profile 41 are formed by etching the base surface 43 along a (111) crystalline plane. Because crystal dissolution by chemical etching is slowest along the (111) crystalline plane, a selective etchant will preferentially etch the orientation substrates $S_1$ and $S_2$ by exposing the (111) crystalline planes. The etch rate along the (100) crystalline plane is one to two orders of magnitude greater than the etch rate along the (111) crystalline plane.

In one embodiment of the present invention, as illustrated in FIGS. 6 and 7, the (111) crystalline plane of the first side profile 31 intersects the mounting surface 21 at an angle $\theta_1$ of about 54.74 degrees and the (111) crystalline plane of the second side profile 41 intersects the base surface 43 at an angle $\theta_2$ of about 54.74 degrees.

In another embodiment of the present invention, as illustrated in FIGS. 6 and 7, the (111) crystalline plane of the first side profile 31 intersects the mounting surface 21 at an angle $\theta_1$ of about 70.53 degrees and the (111) crystalline plane of the second side profile 41 intersects the base surface 43 at an angle $\theta_2$ of about 70.53 degrees.

The first 31 and second 41 side profiles can be formed by an anisotropic etch process. Suitable materials for the anisotropic etch process include tetramethyl ammonium hydroxide (TMAH) and potassium hydroxide (KOH). Hydrogen bubbles in the TMAH can result in the formation of pyramids (hillcocks) on the first 31 and second 41 side profiles. The hydrogen bubbles cling to the surface of the Si and mask the surface beneath the bubbles from the etchant. The hillcocks can be removed by using a higher concentration of TMAH, preferably from about 5 weight percent to about 7 weight percent. The formation of the hillcocks can be completely eliminated by adding from about 5 grams per liter to about 10 grams per liter of either potassium (K) or ammonium peroxydisulfate to the TMAH.

In FIG. 6, the chip 40 is etched from the substrate $S_2$ by masking a portion of the base surface 43 with an etch resistant mask $M_2$ thereby exposing the unmasked portion of the base surface 43 to the etchant. The entire substrate $S_2$ is subjected to an anisotropic etch process that dissolves the substrate $S_2$ in the areas shown by the dashed line. Resulting is the chip 40 of FIG. 8.

Similarly, in FIG. 7, the pocket 30 is etched into the mounting surface 21 of the substrate $S_1$ by masking those portions of the mounting surface 21 that are not to be etched with an etch resistant mask $M_1$. The entire substrate $S_1$ is subjected to an anisotropic etch process that dissolves the substrate $S_1$ in the areas not covered by the mask $M_1$. Resulting is the pocket 30 of FIG. 8.

Photolithography methods common to the semiconductor art can be used to pattern and etch the masks $M_1$ and $M_2$. To ensure the features on the masks are aligned with the (111) crystalline plane of the substrate, at least one pre-etched pit (not shown) can be etched into the substrates $S_1$ and $S_1$ to identify the proper orientation of the (111) crystalline plane relative to the (100) orientation of the substrates $S_1$ and $S_1$.

Figure 4:
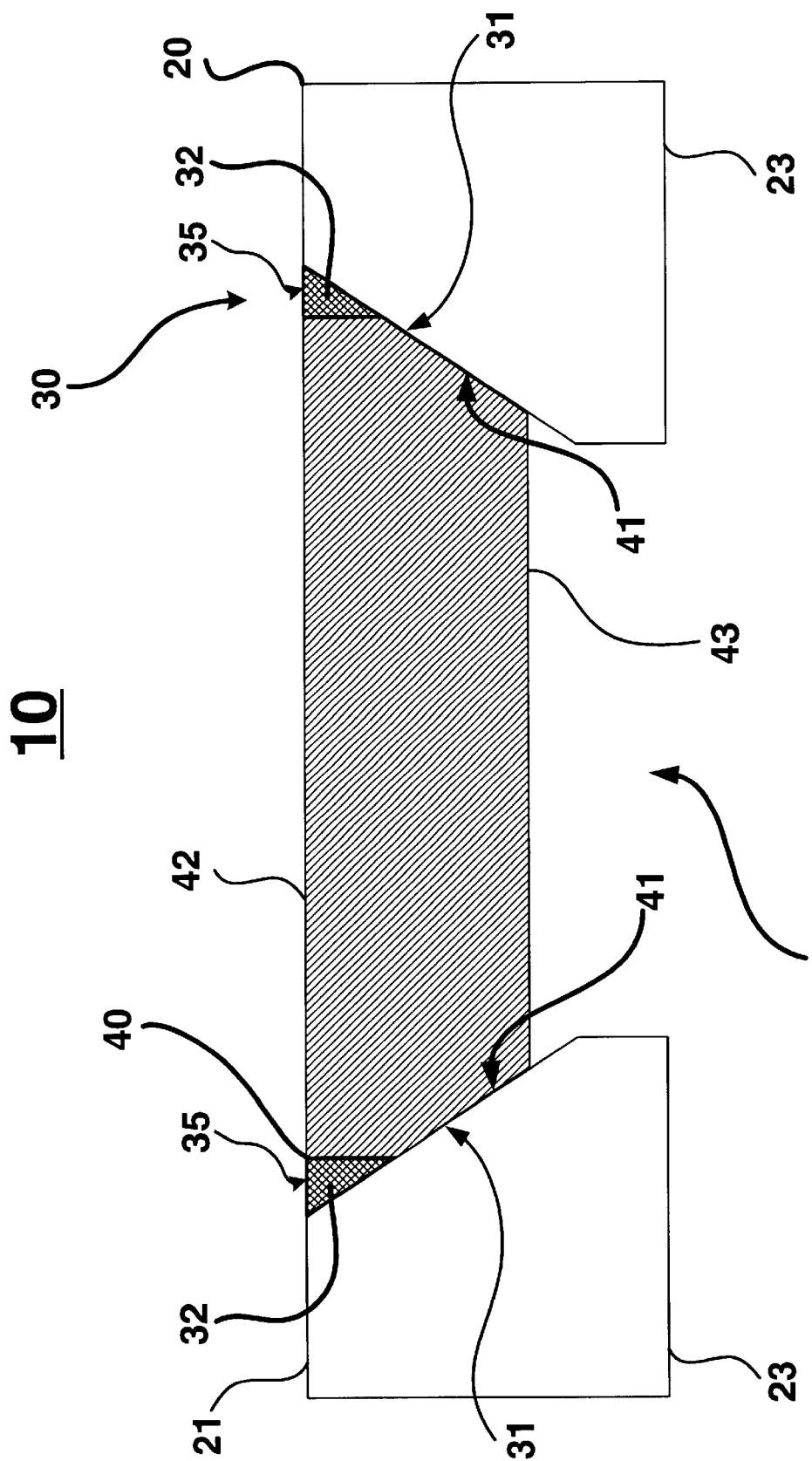
FIG. 4 is a cross-sectional view illustrating an adhesive filling a peripheral gap according to the present invention.

In FIG. 4, a peripheral gap 32 between the chip 40 and the pocket 30 can be filled by an adhesive 35, as illustrated in FIGS. 3 and 4. The adhesive 35 seals the peripheral gap 32 and retains the chip 40 in the pocket 30. For example, if the chip 40 is an inkjet printhead, then sealing the peripheral gap 32 may be necessary to prevent the chip 40 from being pushed out of the pocket 30 by ink (not shown) supplied to the printhead and/or to prevent the ink from leaking through the peripheral gap 32.

Figure 5:
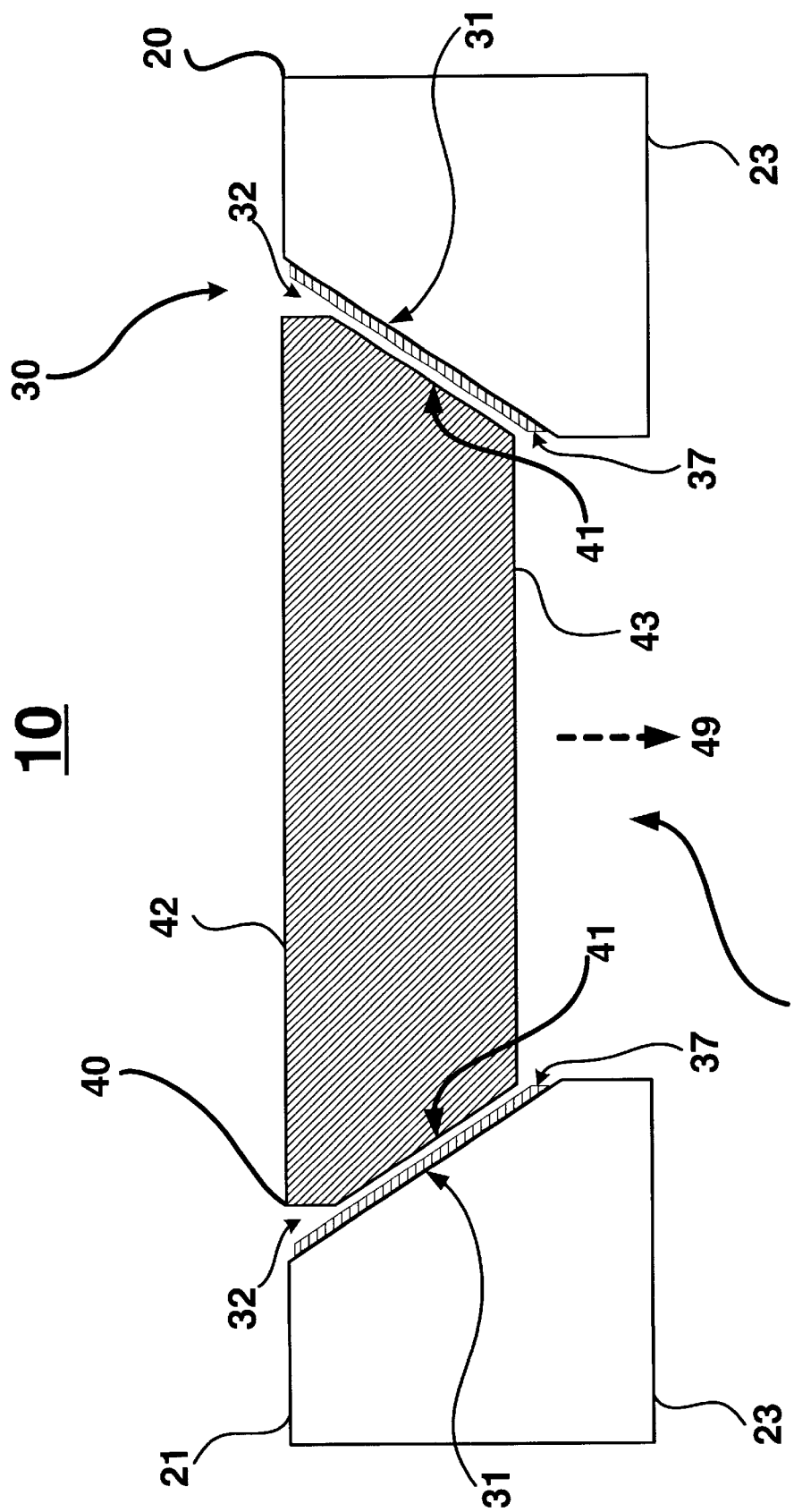
FIG. 5 is a cross-sectional view illustrating a low viscosity adhesive disposed on a side profile according to the present invention.

In another embodiment of the present invention, as illustrated in FIG. 5, either one of the first 31 and second 41 side profiles can include a low viscosity adhesive 37 disposed thereon. The low viscosity adhesive 37 lubricates the first 31 and second 41 side profiles and effectuates mating of the first side profile 31 to the second side profile 41 by reducing friction between the first 31 and second 41 side profiles.

In one embodiment of the present invention, either one of the chip 40 and the carrier substrate 20 are oxidized to form a silicon oxide ($SiO_2$) layer thereon and the the first 31 and second 41 side profiles are atomically flat along a portion of their respective (111) crystalline planes. The chip 40 is mounted to the carrier substrate 20 by an anodic bond between the first 31 and second 41 side profiles. The first 31 and second 41 side profiles can be formed by an anisotropic etch process as described above. The peripheral gap 32 can be filled by the adhesive 35 as described above.

The chip 40 is not to be construed as being limited to inkjet technology. Because of the material match between the chip 40 and the carrier substrate 20, the chip 40 can be an inkjet printhead, a thermal inkjet printhead, a semiconductor, an integrated circuit (IC), an application specific integrated circuit (ASIC), a MicroElectroMechanical System (MEMS), or a fluidic device. The carrier substrate 20 can include chips 40 that are a combination of the above. For instance, the carrier substrate 20 can include one or more thermal inkjet printheads and one or more ASIC's. The interconnect 29 (see FIGS. 1 and 10) can be used to connect the electrically conductive nodes 27 of the printheads, the ASIC's, and the carrier substrate 20.

Although several embodiments of the present invention have been disclosed and illustrated, the invention is not limited to the specific forms or arrangements of parts so described and illustrated. The invention is only limited by the claims.

What is claimed is:

1. A self-aligned common carrier, comprising:
    a carrier substrate including a pocket formed in a mounting surface thereof and extending at least partially towards a backside surface of the carrier substrate,
    the pocket includes a first side profile formed on at least a portion thereof; and
    a chip including a second side profile formed on at least a portion of a base surface of the chip, the second side profile is identical to the first side profile so that the first and second side profiles complement each other, and
    the chip is mounted to the carrier substrate by inserting the base surface of the chip into the pocket so that the second side profile is mated to the first side profile, wherein the chip is positioned in near perfect self-alignment with at least two orthogonal planes of the carrier substrate.

2. The self-aligned common carrier of claim 1, wherein the carrier substrate and the chip are made from a single crystal semiconductor material and the first and second side profiles are formed by etching those side profiles along identical crystalline planes of the single crystal semiconductor material.

3. The self-aligned common carrier of claim 1, wherein the carrier substrate and the chip are made from a material comprising single crystal silicon and the first and second side profiles are formed by etching the first and second side profiles along identical crystalline planes of the single crystal silicon.

4. The self-aligned common carrier of claim 3, wherein the mounting surface and the base surface have a 100 crystalline orientation, the first side profile is formed by etching the mounting surface along a 111 crystalline plane, and the second side profile is formed by etching the base surface along a 111 crystalline plane.

5. The self-aligned common carrier of claim 4, wherein the 111 crystalline plane of the first side profile intersects the mounting surface of the carrier substrate at an angle of about 54.74 degrees and the 111 crystalline plane of the second side profile intersects the base surface of the chip at an angle of about 54.74 degrees.

6. The self-aligned common carrier of claim 4, wherein the first and second side profiles are atomically flat along at least a portion of their respective 111 crystalline planes and the chip is mounted to the carrier substrate by an anodic bond between the first and second side profiles.

7. The self-aligned common carrier of claim 6 and further comprising an adhesive adapted to fill a peripheral gap between the pocket and the chip when the chip is mounted to the carrier substrate, whereby the chip is fixedly retained in the pocket and the peripheral gap is sealed by the adhesive.

8. The self-aligned common carrier of claim 1, wherein the orthogonal planes are an X-plane and a Y-plane of the carrier substrate.

9. The self-aligned common carrier of claim 8, wherein the chip is substantially self-aligned with a Z-plane of the carrier substrate.

10. The self-aligned common carrier of claim 1 and further comprising:
    at least two electrically conductive nodes, the electrically conductive nodes are disposed on either one of the chip and the carrier substrate; and an interconnect adapted to electrically connect the electrically conductive nodes.

11. The self-aligned common carrier of claim 1, wherein either one of the first and second side profiles includes a low viscosity adhesive disposed thereon, the low viscosity adhesive is adapted to lubricate the first and second side profiles and to effectuate mating between the first and second side profiles by reducing friction therebetween.

12. The self-aligned common carrier of claim 1 and further comprising an adhesive adapted to fill a peripheral gap between the pocket and the chip when the chip is mounted to the carrier substrate, whereby the chip is fixedly retained in the pocket and the peripheral gap is sealed by the adhesive.

13. The self-aligned common carrier of claim 1, wherein the chip is a component selected from a group consisting of an inkjet printhead, a thermal inkjet printhead, a semiconductor, an IC, an ASIC, a MicroElectroMechanical System, and a fluidic device.

\* \* \* \* \*